US009240225B2

(12) United States Patent
Mueller et al.

(10) Patent No.: US 9,240,225 B2
(45) Date of Patent: Jan. 19, 2016

(54) CURRENT SENSE AMPLIFIER WITH REPLICA BIAS SCHEME

(71) Applicant: Infineon Technologies AG, Neubiberg (DE)

(72) Inventors: David Mueller, Unterhaching (DE); Thomas Nirschl, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/160,784

(22) Filed: Jan. 22, 2014

(65) Prior Publication Data

US 2014/0133250 A1   May 15, 2014

Related U.S. Application Data

(63) Continuation of application No. 13/113,427, filed on May 23, 2011, now Pat. No. 8,743,630.

(51) Int. Cl.
| *G11C 7/08* | (2006.01) |
| *G11C 7/06* | (2006.01) |
| *G11C 7/12* | (2006.01) |
| *G11C 7/18* | (2006.01) |

(52) U.S. Cl.
CPC .............. *G11C 7/065* (2013.01); *G11C 7/062* (2013.01); *G11C 7/08* (2013.01); *G11C 7/12* (2013.01); *G11C 7/18* (2013.01)

(58) Field of Classification Search
CPC .............. G11C 7/08; G11C 7/12; G11C 7/18; G11C 7/065; G11C 7/062
USPC ............................................ 365/189.15, 203
See application file for complete search history.

(56) References Cited

U.S. PATENT DOCUMENTS

| 6,498,520 | B1 * | 12/2002 | Yau et al. ...................... 327/108 |
| 6,600,690 | B1 | 7/2003 | Nahas et al. |
| 6,707,717 | B2 | 3/2004 | Jun-Lin |
| 6,944,065 | B2 | 9/2005 | Tedrow et al. |
| 7,126,869 | B1 | 10/2006 | Chou |
| 7,483,294 | B2 | 1/2009 | Gilbert |
| 7,542,352 | B1 * | 6/2009 | Kuo ......................... 365/185.25 |
| 7,542,363 | B2 | 6/2009 | Kubo et al. |
| 2004/0047189 | A1 | 3/2004 | Tran et al. |
| 2008/0137430 | A1 | 6/2008 | Lasseuguette |
| 2009/0086534 | A1 * | 4/2009 | DeBrosse et al. ............. 365/163 |
| 2010/0254490 | A1 | 10/2010 | Moreira |

OTHER PUBLICATIONS

Notice of Allowance dated Jan. 28, 2014 for U.S. Appl. No. 13/113,427. 26 Pages.

(Continued)

*Primary Examiner* — Douglas King
(74) *Attorney, Agent, or Firm* — Eschweiler & Associates, LLC (57) ABSTRACT

Some embodiments of the present disclosure relate to a sense amplifier architecture that facilitates fast and accurate read operations. The sense amplifier architecture includes a folded cascode amplifier for its first sense amplifier stage, and a pre-charge circuit to establish a pre-charge condition for a senseline and a reference senseline of the sense amplifier. The pre-charge circuit and the folded cascode amplifier each include one or more cascode transistors of the same size and which receive the same bias voltage on a gate thereof. This architecture provides fast and accurate read operations in a relatively small footprint, thereby providing a good blend of cost and performance.

12 Claims, 8 Drawing Sheets

(56) References Cited

OTHER PUBLICATIONS

Atsumi, Shigeru, et al. "A Channel-Erasing 1.8-V-Only 32-Mb NOR Flash EEPROM with a Bitline Direct Sensing Scheme." IEEE Journal of Solid-State Circuits, vol. 35, No. 11, Nov. 2000. 7 Pages.

Conte, Antonino, et al. "A High-Performance Very Low-Voltage Current Sense Amplifier for Nonvolatile Memories." IEEE Journal of Solid-State Circuits, vol. 40, No. 2, Feb. 2005. 8 Pages.

Ishibashi, Koichiro, et al. "A 6-ns. 4-Mb CMOS SRAM with Offset-Voltage-Insensitive Current Sense Amplifiers." IEEE Journal of Solid-State Circuits, vol. 30, No. 4, Apr. 1995. 7 Pages.

Kajiyama, Shinya, et al. "A 300 MHz Embedded Flash Memory with Pipeline Architecture and Offset-Free Sense Amplifiers for Dual-Core Automotive Microcontrollers." IEEE Asian Solid-State Circuits Conference. Nov. 3-5, 2008. Fukuoka, Japan. 4 Pages.

Tanzawa, Toru, et al. "Design of a Sense Circuit for Low-Voltage Flash Memories." IEEE Journal of Solid-State Circuits, vol. 35, No. 10, Oct. 2000. 7 Pages.

Non-Final Office Action dated Jun. 20, 2013 for U.S. Appl. No. 13/113,427. 27 Pages.

Final Office Action dated Oct. 10, 2013 for U.S. Appl. No. 13/113,427. 10 Pages.

\* cited by examiner

CURRENT SENSE AMPLIFIER WITH REPLICA BIAS SCHEME

REFERENCE TO RELATED APPLICATION

This application is a continuation of U.S. application Ser. No. 13/113,427 filed on May 23, 2011.

BACKGROUND

With the rise of the modern digital age, semiconductor memory devices are becoming more and more integrated into people's everyday lives. Such memory devices store digitally encoded data for personal computers, communication devices, music players, image processors, automotive systems, and the like.

Figure 1:
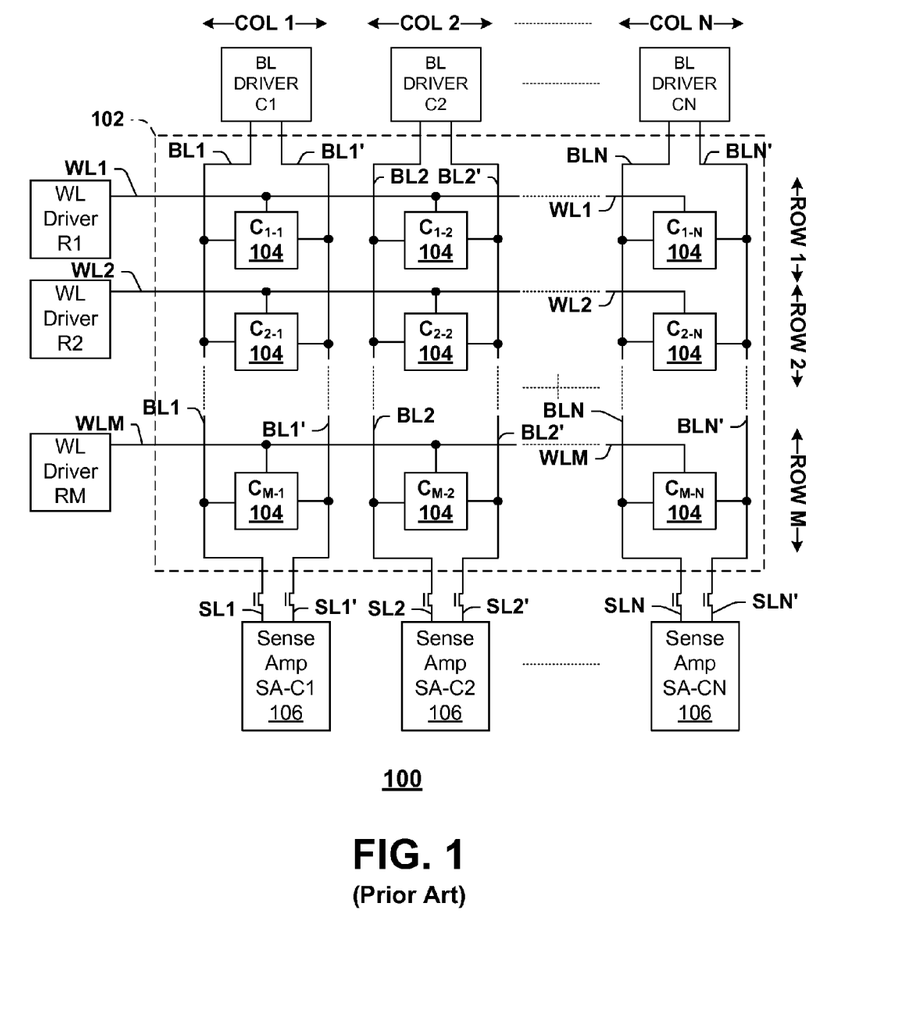
FIG. 1 is a block diagram of a conventional memory device.

FIG. 1 illustrates a portion of a conventional memory device 100 that includes a memory array 102, which is made up of a number of memory cells 104 arranged in M rows (e.g., words) and N columns (e.g., bits), wherein the individual memory cells 104 are labeled as $C_{ROW\text{-}COLUMN}$ for clarity in FIG. 1. Along each row, a wordline is coupled to respective gates of respective access transistors (not shown) within respective memory cells. For example, in Row 1, wordline WL1 is coupled to respective gates of respective access transistors for memory cells $C_{1\text{-}1}$ through $C_{1\text{-}N}$; in Row 2, wordline WL2 is coupled to respective gates of respective access transistors for memory cells $C_{2\text{-}1}$ though $C_{2\text{-}N}$; and so on. Along each column, a pair of complementary bitlines can be coupled to complementary storage nodes of respective memory cells. For example, for Column 1, complementary bitlines BL1, BL1' can be coupled to respective complementary storage nodes of memory cells $C_{1\text{-}1}$ though $C_{M\text{-}1}$; for column 2, complementary bitlines BL2, BL2' can be coupled to respective complementary storage nodes of memory cells $C_{1\text{-}2}$ though $C_{M\text{-}2}$; and so on. Other architectures, such as Flash memory or dynamic random access memory (DRAM) for example, can include a single-ended bitline for each column, as opposed to the complementary bitlines shown in FIG. 1.

To facilitate read operations, sense amps 106 can be coupled to respective columns of memory cells. Each sense amp 106 has a sense line SL and a reference sense line SL'. For example, in the first column in the architecture shown in FIG. 1, sense amp SA-C1 has a sense line SL1 coupled to bitline BL1 and has a reference sense line SL1' coupled to complementary bitline BL1'. In other embodiments, such as a DRAM or flash memory architecture where the cell has only a single bitline and no complementary bitline, the reference senseline SL' can be coupled to a reference cell or some other reference potential.

To read data values from a row of memory cells, the wordline of the row is asserted to establish respective differential biases on the senselines and reference senselines, wherein the differential bias seen by each sense amp depends on the data state read from the corresponding memory cell. For example, if cell $C_{1\text{-}1}$ stores a logical "1" value and $C_{1\text{-}2}$ stores a logical "0" value, assertion of wordline WL1 can lead to a first differential bias on SL1/SL1' (corresponding to a logical "1" which can be detected by sense amp SA-C1) and can concurrently lead to a second, different differential bias on SL2/SL2' (corresponding to a logical "0" which can be detected by sense amp SA-C2). After the sense amps 106 detect the respective differential biases, the sense amps 106 then latch the corresponding data values and another read or write operation can occur.

Although memory devices and sense amplifiers are well known, memory designers are constantly striving to provide faster and more accurate read and write operations so that data can be retrieved and/or processed more quickly. For read operations, the time required for pre-charging of the bitlines and/or sense lines, as well as the time required for sensing the data state leaked onto a bitline/senseline make a significant contribution to the overall read access time. Therefore, although conventional sense amplifiers are sufficient in some regards, the inventors have devised improved sense amplifiers as set forth herein.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Some embodiments of the present disclosure relate to an improved sense amplifier architecture that facilitates fast and accurate read operations. The sense amplifier architecture includes a folded cascode amplifier for its first sense amplifier stage, and a pre-charge circuit to establish a pre-charge condition for a senseline and a reference senseline of the sense amplifier. The pre-charge circuit and the folded cascode amplifier each include one or more cascode transistors of the same size and which receive the same bias voltage on a gate thereof. This architecture provides fast and accurate read operations in a relatively small footprint, thereby providing a good blend of cost and performance.

Figure 2:
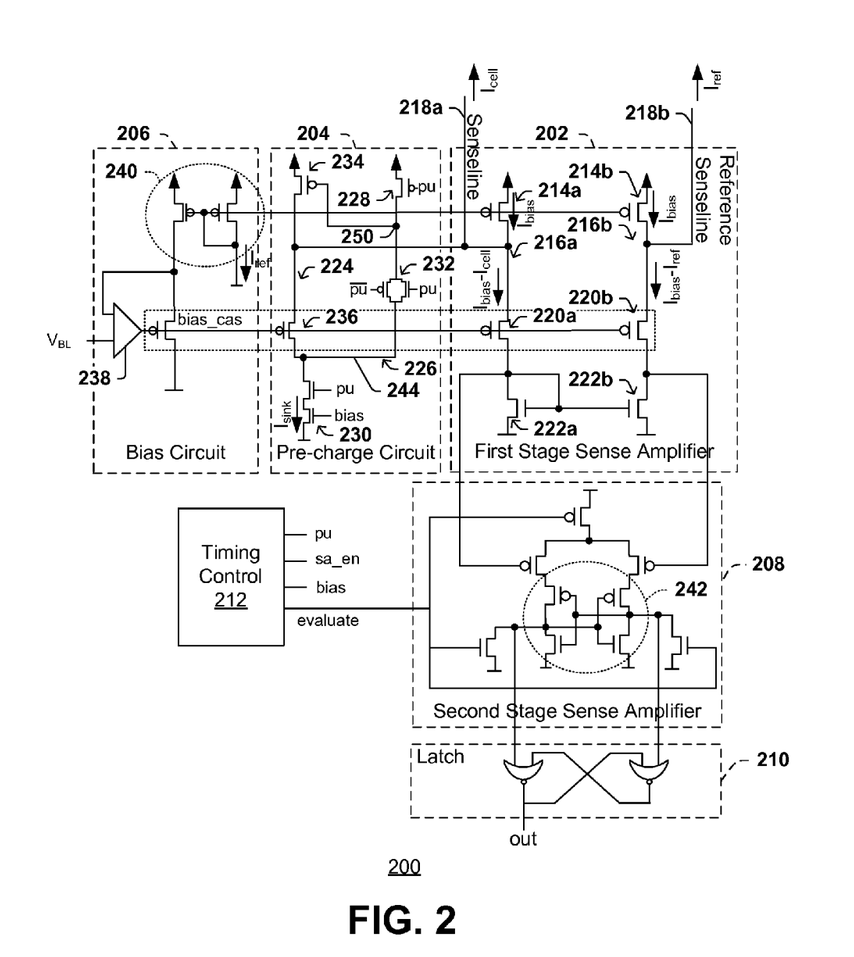
FIG. 2 is a circuit diagram of a sense amplifier in accordance with some embodiments.

FIG. 2 shows a sense amplifier 200 in accordance with some embodiments. The sense amplifier 200 includes a first stage sense amplifier 202 in the form of a folded cascode amplifier and a pre-charge circuit 204. In addition, the sense amplifier 200 can include a bias circuit 206, a second stage sense amplifier 208, a latch element 210, and a timing control circuit 212, all of which are coupled as shown.

The first stage sense amplifier 202 includes first and second current source transistors (214a, 214b) configured to provide first and second currents, respectively, along first and second current paths (216a, 216b), respectively. First and second cascode transistors (220a, 220b, respectively) and first and second current mirror transistors (222a, 222b, respectively) are arranged on the first and second current paths (216a, 216b, respectively) and are in series with the first and second current source transistors (214a, 214b), respectively. A senseline 218a has one of its ends coupled to a node between the first current source transistor 214a and the first cascode transistor 220a, and has its other end coupled to a bitline (not shown in FIG. 2, but see e.g., FIGS. 9-11). A reference senseline 218b has one of its ends coupled to a node between the second current source 214b and the second cascode transistor 220b, and has its other end coupled to a reference potential, such as a complementary bitline or a reference cell (not shown in FIG. 2, but see e.g., FIGS. 9-11).

The pre-charge circuit 204 includes a third current path 224, which may be referred to as an additional current path in some implementations, and a fourth current path 226, which both stem from a pull-down current element 230. The third current path 224 includes a pre-charge device 234 in series with a third cascode transistor 236 (which may be referred to as an additional cascode transistor in some implementation), wherein the third cascode transistor 236 is at least approximately the same size as the first and second cascode transistors 220a, 220b. Note that "approximately the same size" means that the cascode transistors (220a, 220b, and 236) can be specified to have equal lengths and widths during design, but may as a practical matter exhibit small size deviations from one another due to slight variations in the manufacturing process. The cascode transistors can be scaled, for example, 236 can be approximately half the size of 220a and 220b and $I_{sink}$ can be half of the current through 220a, 220b. The fourth current path 226, which may also be referred to as a feedback path, includes a switching element (e.g., transmission gate 232).

The bias circuit 206 has an output port that biases both the first stage sense amplifier 202 and the pre-charge circuit 204. To facilitate this functionality, the output port of the bias circuit 206 is driven by differential amplifier 238. A pair of current source transistors 240 is also included, as shown.

Operation of the sense amplifier 200 is now described in more detail. Prior to a read operation, the pull-up signal (pu) is low, thereby enabling transistor 228 while concurrently disabling transistor 234 and transmission gate 232. This condition charges storage node 250 to near VDD. Because storage node 250 is isolated due to signal pu being low, there is little or no power dissipation during this time.

At the start of a read operation, an address (from which data is to be read) is presented to the memory device and the senseline 218a is connected to a bitline corresponding to the presented address. Because the bitline has a relatively large capacitance, it is useful to pre-charge the bitline and senseline 218a to allow for faster read operations.

To achieve such a pre-charge condition, the timing control circuit 212 pulses pull-up signal (pu) high (e.g., to a logical "1" or VDD), which turns off pull-up current element 228 while concurrently enabling transmission gate 232 and NMOS driven by signal pu on path 230. This causes the pent up charge on storage node 250 to flow through path 226, thereby pulling down node 250 and turning on pull up element 234. Due to this decreased gate voltage on pull up element 234, charge flows onto the senseline 218a and bitline via pull up element 234, thereby establishing a pre-charge condition on the senseline 218 and bitline. Because the bias_cas signal is continuously applied, the potential on nodes 244 and 250 gradually builds as the senseline 218a is charged, which eventually limits the pre-charge through 234 after some time. In this sense, the pre-charge circuit 204 is self-regulating and provides an efficient manner of pre-charging the senseline 218a and bitline. Eventually, the pull-up signal (pu) is de-asserted, even though pre-charging has likely been already limiting to the self-regulating behavior of the pre-charge circuit.

After the pre-charge condition has settled on the senseline 218a, the timing control circuit 212 can assert a wordline of the accessed memory cell. This causes a differential bias to develop with respect to the senseline 218a and reference senseline 218b, wherein the differential bias corresponds to a data value read from the memory cell.

After this differential bias has settled, the timing control circuit 212 couples the second stage sense amplifier 208 to the first stage sense amplifier 202 via the evaluate signal. Cross coupled inverters 242 in the second stage sense amplifier then flip one way or the other, depending on what differential bias in received from the first stage sense amplifier 202. After the second stage sense amplifier 208 has resolved the data state represented on the bitline (and hence has resolved the data state previously stored in the memory cell), the latch element 210 (e.g., cross-couple NOR latch) latches the detected data state. After the dectected data state has been latched, the bitline is decoupled from the sense amp and the next read or write operation can be carried out.

Figure 3:
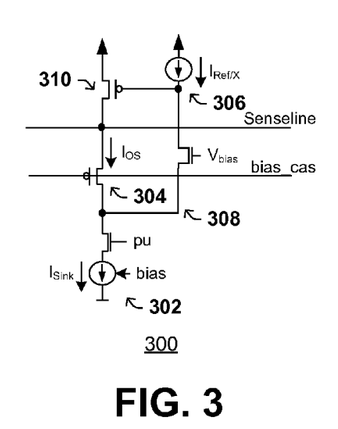
FIGS. 3-4 are circuit diagrams of pre-charge circuits that can be included in sense amplifiers in accordance with some embodiments.
Figure 4:
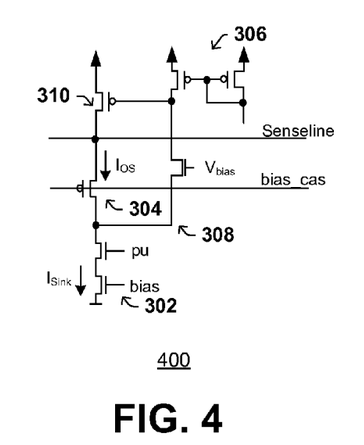

The pre-charge circuit 204 of FIG. 2 is suitable for where the supply voltage ($V_{DD}$) is lower than the bitline voltage ($V_{BL}$) plus a threshold voltage for the transistors of the sense amp ($V_{TH}$) (e.g., where $V_{DD} < V_{BL} + V_{TH}$). For supply voltages higher than $V_{BL} + V_{TH}$, FIGS. 3-4 illustrate additional embodiments of pre-charge circuits 300, 400, respectively, which can be used in place of the pre-charge circuit 204 of FIG. 2. Again, these pre-charge circuits 300, 400 are typically useful where a supply voltage $V_{DD}$ higher than $V_{BL} + V_{TH}$ is used.

In particular, these embodiments include a pull down current source 302 along a first current path 304 of the circuit, as well as a pull up current source 306 that delivers a current through a feedback path 308 of the pre-charge circuit. Often, the pull down current source 302 is larger than the pull-up current source 306. During operation, when the current through the first current path 304 ($I_{OS}$) starts to exceed ($I_{ref} - I_{ref}/X$), then the voltage on the gate of the pre-charge transistor 310 starts to increase until eventually reaching VDD and turning off the pre-charge transistor 310, thereby stopping the pre-charge to the first stage of the sense amp. It will be appreciated that FIG. 4 merely shows one example of circuit schematics can that can used to implement current sources and that other circuits could also be used.

Figure 5:
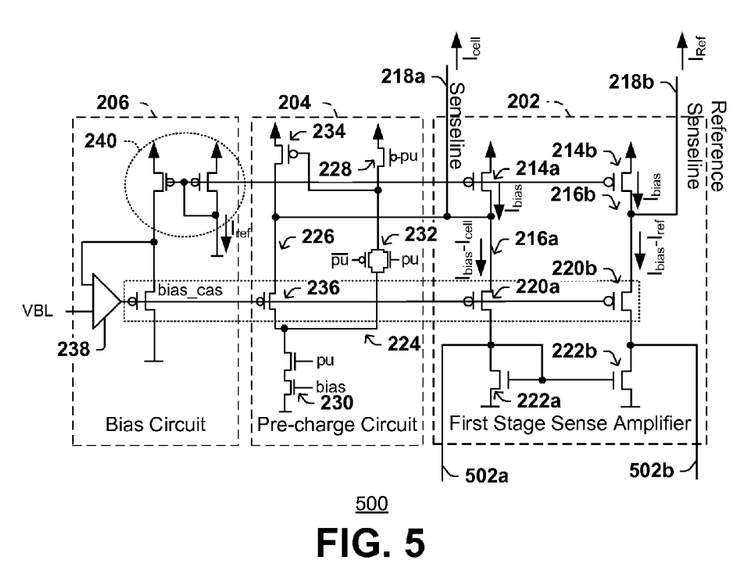
FIG. 5 is a block diagram of a first stage sense amplifier in accordance with some embodiments.

Although FIG. 2 shows an example where the first stage provides a differential output, single ended configurations also fall within the scope of the present disclosure. For example, FIG. 5 shows an example of the first stage sense amp 500 where only the first output (e.g., 502b) is used. In this embodiment, the first output is not full swing, but is still high enough for single ended use in some applications. The second output (502a) is simply un-used.

Figure 6:
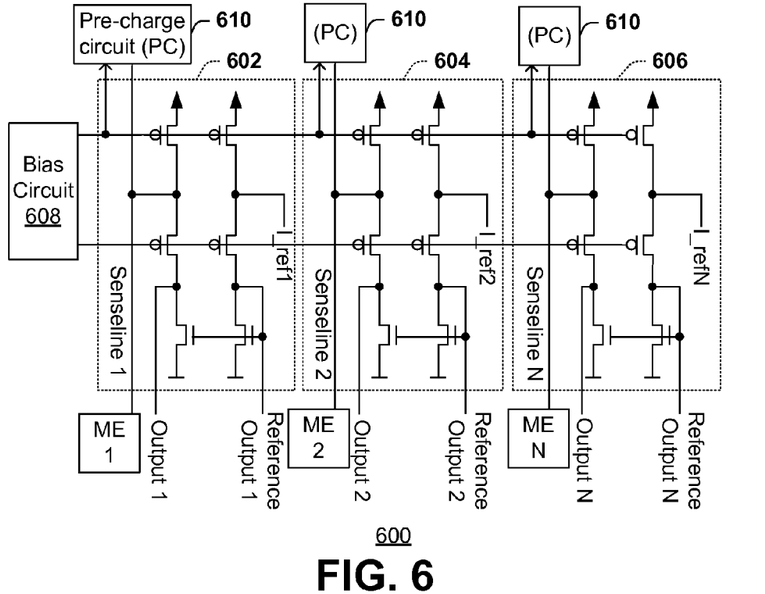
FIG. 6 is a circuit diagram of a number of first stage sense amplifiers in accordance with some embodiments.

FIG. 6 shows another embodiment 600 that includes N first stage sense amplifiers (602, 604, ... 606). N senselines (Senseline 1, ... Senseline N) couple the N sense amps to N memory element (ME 1, ..., ME N), respectively, wherein each memory element can include an individual memory cell or a column of memory cells. A bias circuit 608 provides a bias signal to the sense amps as well to pre-charge circuitry 610. The pre-charge circuitry 610 is configured to pre-charge the senselines. In this example, each first stage sense amplifier provides a sense output voltage and a reference sense output voltage at its output. The sense output voltage corresponds to a data value read from the corresponding memory cell, while the reference output voltage falls between voltages of expected data states for the memory cell. A second stage of the sense amplifier (not shown) is coupled to each first stage sense amplifier and receives both the sense output voltage and reference sense output voltage signals to discern a data state read from a memory cell.

Figure 7:
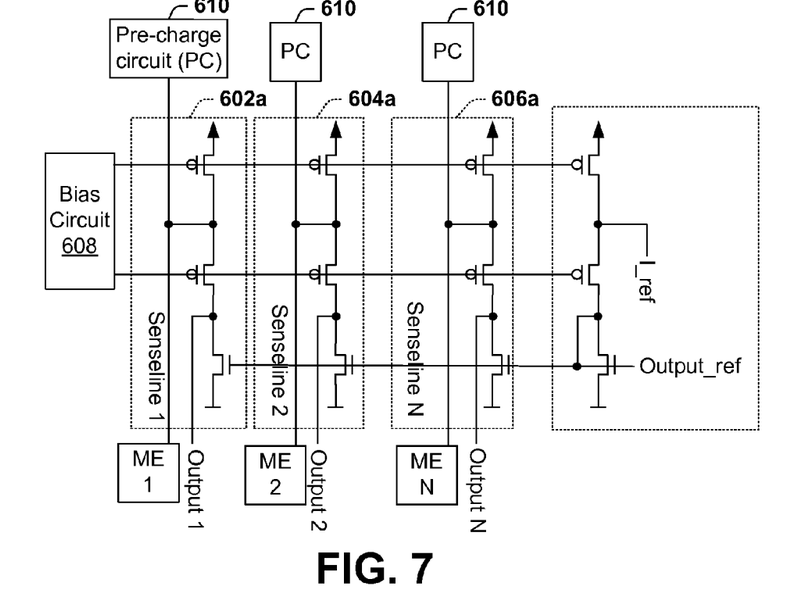
FIG. 7 is a circuit diagram of a number of first stage sense amplifiers in accordance with some embodiments.

To save area and power compared with FIG. 6's embodiment, FIG. 7 shows another embodiment where each first stage sense amplifier can share a common reference output voltage (output_ref), rather than providing its own reference output voltage as shown in FIG. 6. Thus, in FIG. 7, second stage amplifiers (not shown) are respectively coupled to first stage amplifiers and receive the sense output voltages from the respective first stage amplifiers. The second stage amplifiers (not shown) all receive the reference output voltage (output_ref) for differential embodiments. Single ended embodiments are also possible, simply output from output_#. Compared to FIG. 6's embodiment, FIG. 7's embodiment may provide diminished performance, albeit at a lower cost point.

Figure 8:
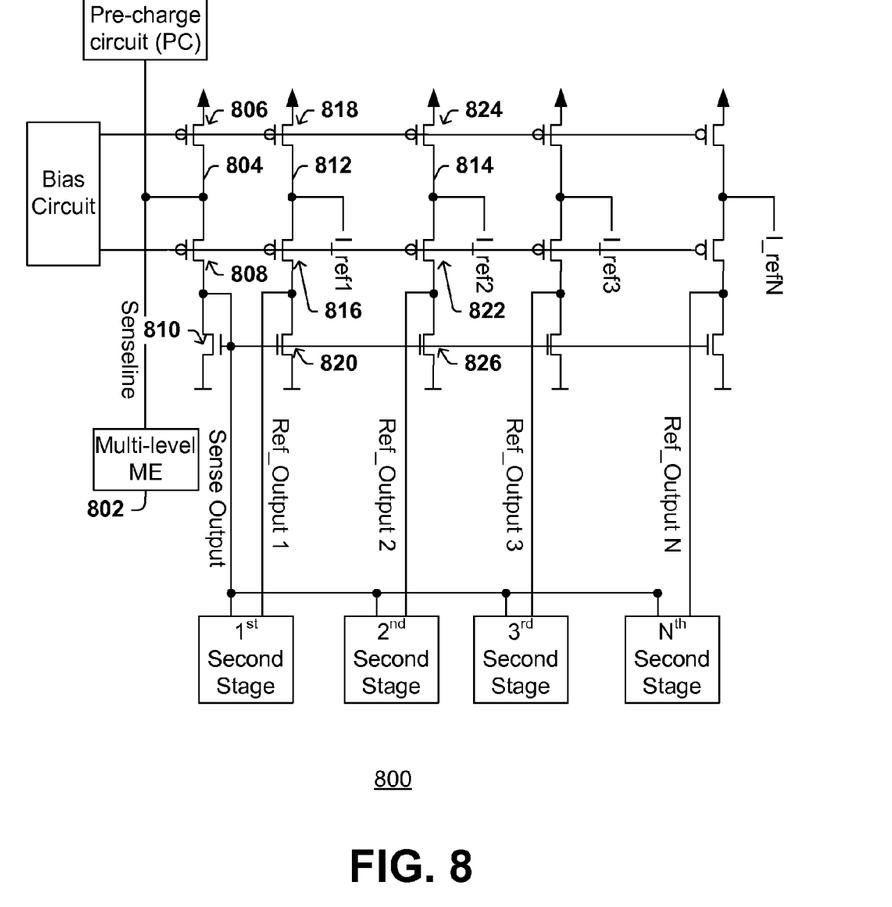
FIG. 8 is a circuit diagram of first stage sense amplifier configured to be coupled to a multi-level memory cell in accordance with some embodiments.

FIG. 8 shows still another embodiment where a sense amplifier 800 is used in conjunction with a multi-level memory element 802 coupled to the sense line. In this embodiment, the sense amplifier 800 includes a first current path 804 coupled to a senseline and bitline of the multi-level memory element 802. The first current path 804 is made up of a first current source transistor 806, a first cascode transistor 808, and a first current mirror transistor 810. To help determine a data state sensed from the multi-level memory element 802, the sense amplifier 800 includes a second current path 812, a third current path 814, etc., which establish multiple respective reference currents (I_ref1, ... I_refN). The second current path 812 includes a second cascode transistor 816, a second current source transistor 818, and a second current mirror transistor 820; the third current path 814 includes a third cascode transistor 822, a third current source transistor 824, and a third current mirror transistor 826; and so on. Each second amplifier stage can compare the sensed current from the multi-level memory element 802 to a different reference current to discern between a pair of adjacent data states for the memory element 802. For example, consider an example of a flash memory cell where each of four data states corresponds to a different current being sourced (or sunk) by the flash memory cell. In such an example, a first data state (e.g., 00) can correspond to a cell current less than the first reference current ($I_{cell} < I_{ref1}$), a second data state (e.g., 01) can correspond to a cell current between the first reference current and a second reference current (e.g., $I_{ref1} < I_{cell} < I_{ref2}$); a third data state (e.g., 10) can correspond to a cell current between the second reference current and a third reference current (e.g., $I_{ref2} < I_{cell} < I_{ref3}$); and a fourth data state (e.g., 11) can correspond to a cell current that is greater than a fourth reference current (e.g., $I_{cell} < I_{ref4}$).

Figure 9:
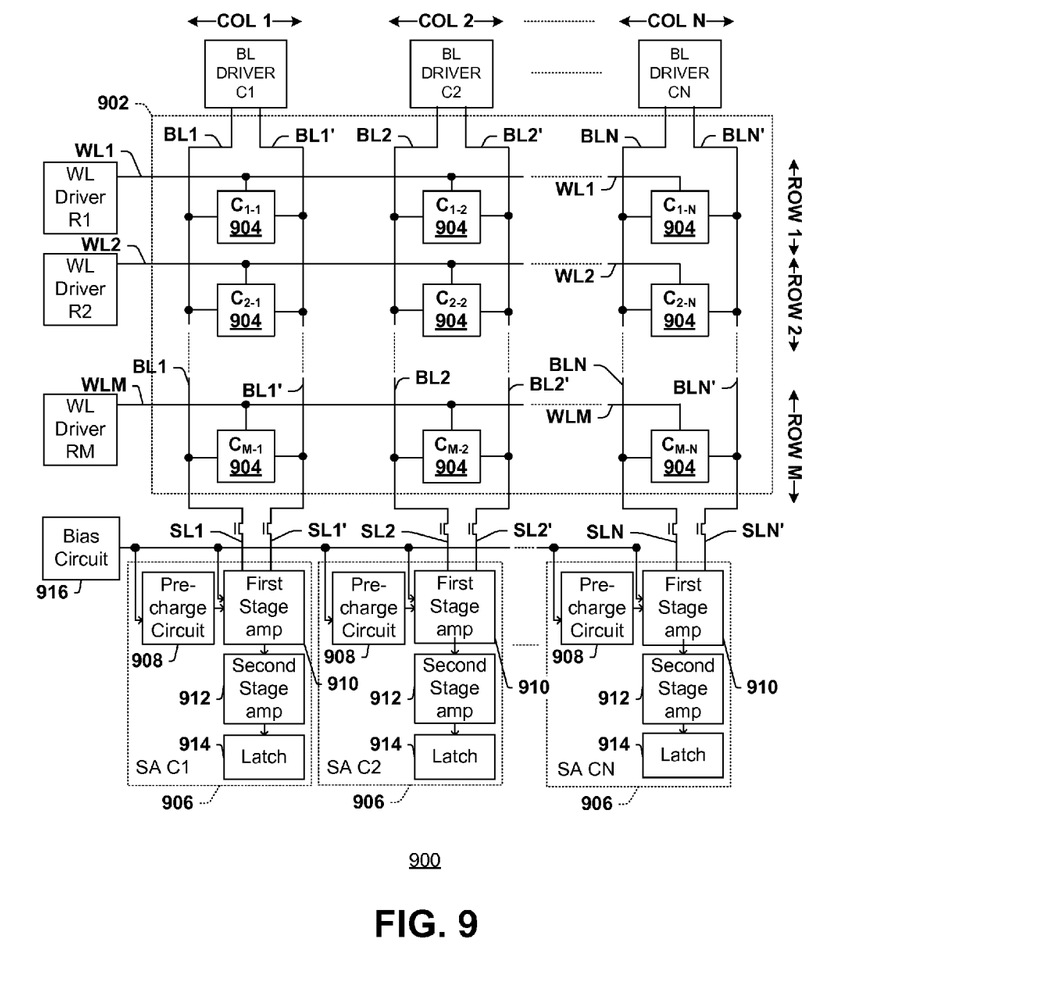
FIG. 9 is a block diagram of a memory device that includes a number of sense amps in accordance with some embodiments.

FIG. 9 shows an example of a memory device 900 that makes use of a sense amplifier architecture in accordance with some embodiments. The memory device includes a memory array 902, which is made up of a number of memory cells 904 arranged in M rows (e.g., words) and N columns (e.g., bits), wherein the individual memory cells 104 are labeled as $C_{ROW-COLUMN}$.

Along each row, a wordline is coupled to respective access transistor gates (not shown) within respective memory cells. For example, in Row 1, wordline WL1 is coupled to respective access transistor gates for memory cells $C_{1-1}$ through $C_{1-N}$; in Row 2, wordline WL2 is coupled to respective access transistor gates for memory cells $C_{2-1}$ though $C_{2-N}$, and so on. Along each column, a pair of complementary bitlines can be coupled to complementary storage nodes of respective memory cells. For example, for Column 1, complementary bitlines BL1, BL1' can be coupled to respective complementary storage nodes of memory cells $C_{1-1}$ though $C_{M-1}$; for column 2, complementary bitlines BL2, BL2' can be coupled to respective complementary storage nodes of memory cells $C_{1-2}$ though $C_{M-2}$, and so on. Sense amplifiers 906 are coupled to respective columns, and include sense lines (e.g., SL1) and reference senseline (e.g., SL1') coupled to respective complementary bitlines.

Each sense amplifier includes a pre-charge circuit 908 (e.g., pre-charge circuit 204 of FIG. 2), a first amplifier stage 910 (e.g., first amplifier stage 202 of FIG. 2), a second amplifier stage 912 (e.g., second amplifier stage 208 of FIG. 2), and a latch 914 (e.g., latch 210 of FIG. 2). A bias circuit 916 (e.g., bias circuit 206 in FIG. 2) provides a voltage bias to the sense amplifiers as shown.

Figure 10:
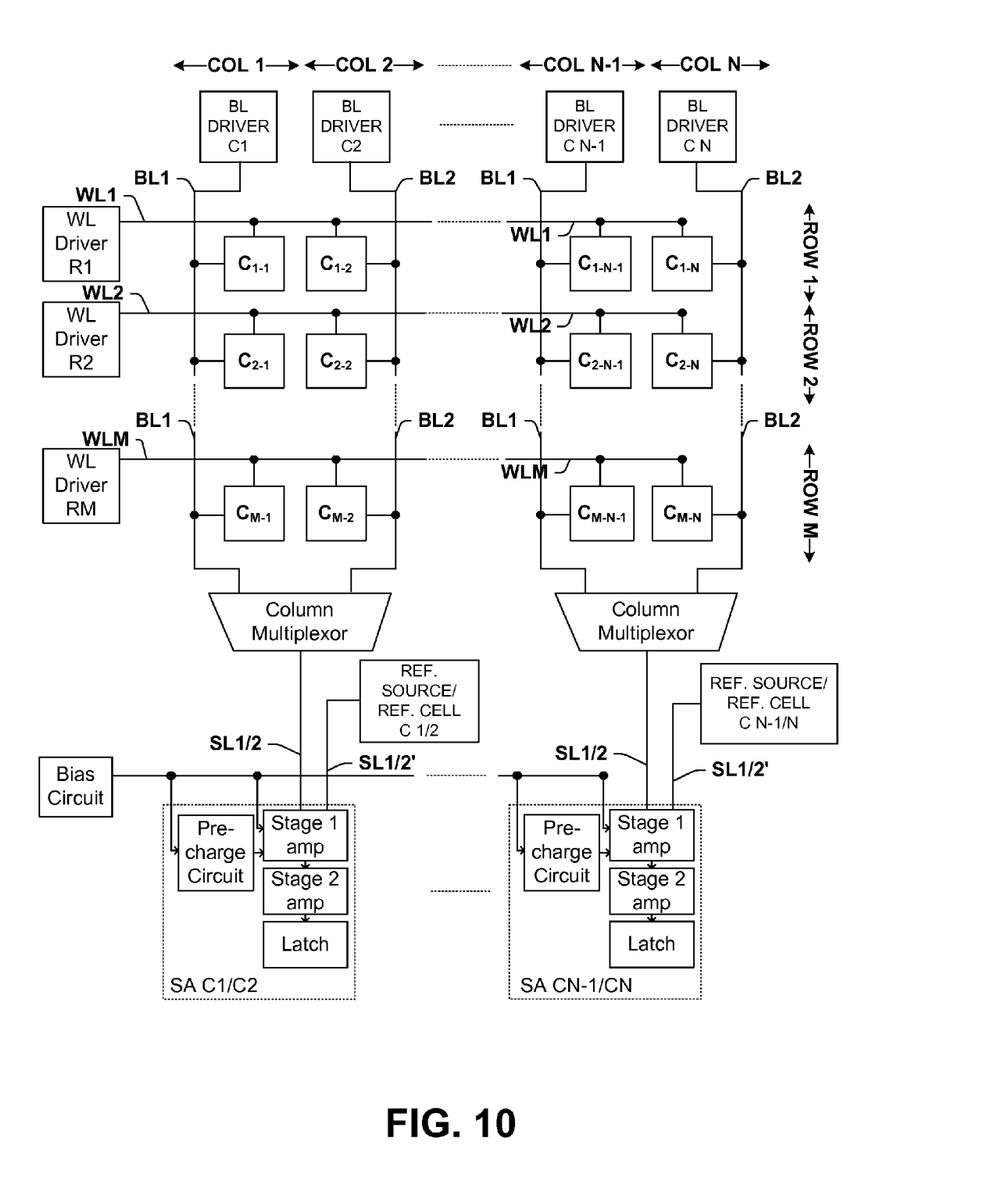
FIG. 10 is a block diagram of a memory device that includes a number of sense amps in accordance with other embodiments.

FIG. 10 shows another memory device wherein each memory cell includes a single-ended bitline, rather than a complementary bitline pair as shown in FIG. 9. Further, in FIG. 10 adjacent columns of memory cells share a sense amplifier via a column multiplexor. Because each column of cells makes use of a single-ended bitline, the memory device includes one or more reference cells or other reference sources (e.g., a bandgap circuit or some other reference circuit) that provide a reference potential to a reference senseline of a given sense amp. It will be appreciated that more than two columns can share a senseamp, depending on the implementation.

Figure 11:
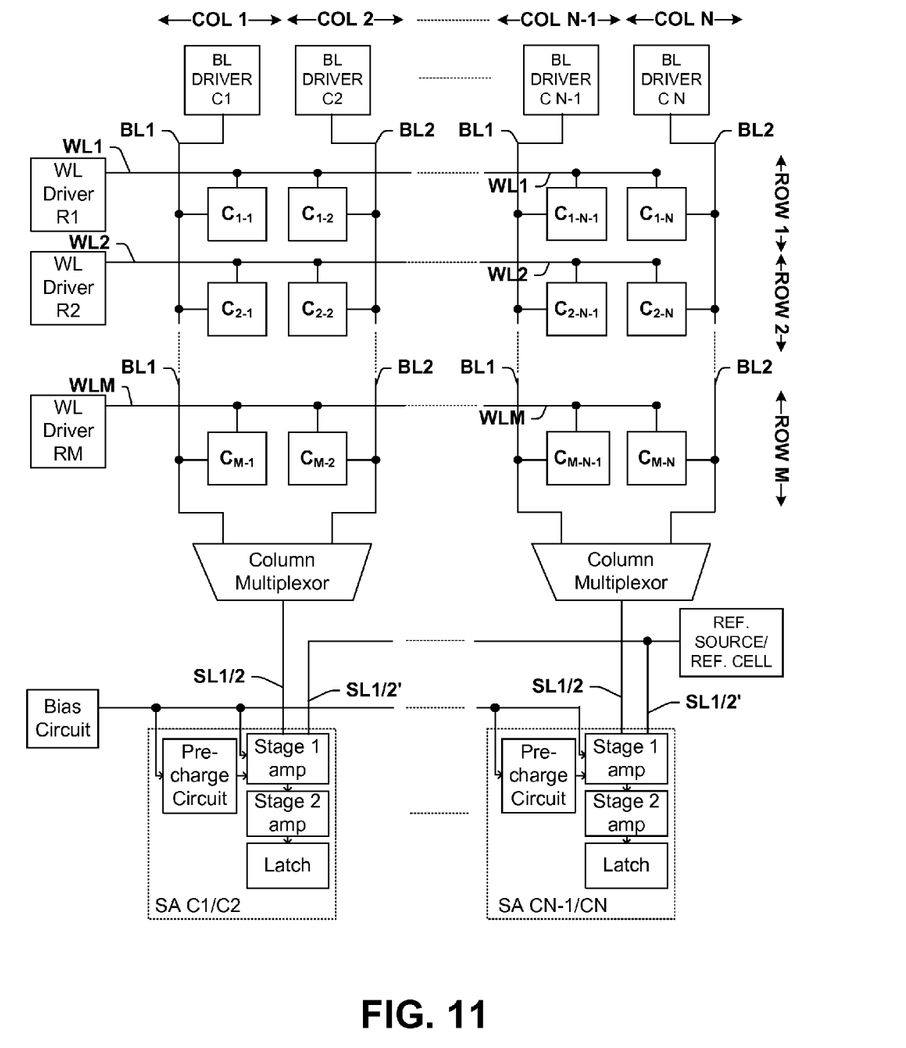
FIG. 11 is a block diagram of a memory device that includes a number of sense amps in accordance with other embodiments.

FIG. 11 shows another embodiment where the sense amps all share a reference cell or other reference source. It will be appreciated that this embodiment may save some hardware relative to FIGS. 9-10. Thus, FIG. 11's shared reference cell/ reference source may reduce cost and power requirements, relative to the embodiments of FIGS. 9-10, but can also offer somewhat diminished performance relative to those embodiments.

Combinations of the architectures of FIG. 9-11 are also contemplated as falling within the scope of the present disclosure. For example, although FIG. 9 shows a complementary bitline architecture where there is a one-to-one correspondence between columns of memory cells and sense amplifiers, in other complementary bitline architectures a single sense amplifier can be shared between columns, somewhat akin to FIG. 10 or FIG. 11. Further, although FIG. 10 shows a single-ended bitline architecture where sense amps access multiple columns, other single-ended bitline architectures could have a one-to-one correspondence between sense amps and columns of memory cells, somewhat akin to FIG. 9.

Although the disclosure has been shown and described with respect to one or more implementations, equivalent alterations and modifications will occur to others skilled in the art based upon a reading and understanding of this specification and the annexed drawings. For example, although FIG. 2 showed an embodiment that makes use of a specific arrangement of NMOS and PMOS devices, in other implementations the NMOS and PMOS devices can be "flipped" along with there corresponding bias conditions. In addition, it will be appreciated that current sources and current sinks are legal equivalents to one another as are pull-up and pull-down devices, as they are just "flipped" with respect to one another. All such implementations are contemplated as falling within the scope of the present invention.

Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A sense amplifier for sensing a data value from a senseline coupled to a memory cell, the sense amplifier comprising:
   first and second current source transistors configured to provide first and second currents, respectively, along first and second current paths, respectively, wherein the first current path is coupled to the senseline and wherein the second current path is coupled to a reference senseline;
   first and second cascode transistors arranged in series with the first and second current source transistors, respectively, and arranged on the first and second current paths, respectively;
   first and second current mirror transistors arranged in series with the first and second cascode transistors, respectively, and arranged on the first and second current paths, respectively, wherein the respective cascode transistors are disposed between the respective current source transistors and the respective current mirror transistors on the first and second current paths; and
   a pre-charge circuit configured to establish a pre-charge condition on the senseline, wherein the pre-charge circuit comprises:
      a pre-charge transistor having a gate, a source coupled to a supply voltage node, and a drain coupled to the senseline; and
      a third cascode transistor having a source coupled to the senseline and having a drain coupled to the gate of the pre-charge transistor via a feedback path.

2. The sense amplifier of claim 1, wherein each of the first, second, and third cascode transistors are of approximately equal size or are of pre-determined width-to-length ratios and wherein the third cascode transistor is coupled to the senseline.

3. The sense amplifier of claim 2, further comprising:
   a bias circuit coupled to the pre-charge circuit and coupled the first, second, and third cascode transistors; and
   wherein respective gate terminals of the first, second, and third cascode transistors are coupled together to receive a bias voltage from the bias circuit.

4. The sense amplifier of claim 3, wherein the-pre-charge transistor is arranged in series with the third cascode transistor on a third current path; and further comprising:
   a pull-up current element arranged on a fourth current path in parallel with the third current path, wherein the pull-up current element has a source coupled to the supply voltage node and a drain coupled to a control terminal of the pre-charge circuit.

5. A sense amplifier for sensing a data value from a senseline coupled to a memory cell, the sense amplifier comprising: a pre-charge circuit comprising: a pre-charge device connected to the senseline and adapted to, prior to a read operation, establish a predetermined pre-charge condition on the senseline; and a feedback path coupling the senseline to a gate terminal of the pre-charge device wherein the feedback path includes a switching element to selectively provide a feedback voltage to the gate terminal of the pre-charge device, wherein the feedback voltage is based on a senseline voltage on the senseline; wherein the pre-charge device comprises: a pre-charge transistor having a gate corresponding to the gate terminal, a source coupled to VDD, and a drain coupled to the senseline; and a cascode transistor having a source coupled to the drain of the pre-charge transistor, and having a drain coupled to the feedback path.

6. The sense amplifier of claim 5, wherein the switching element comprises an NMOS transistor.

7. The sense amplifier of claim 5, wherein the switching element comprises a transmission gate.

8. The sense amplifier of claim 5, wherein the feedback path comprises a transmission gate in series with a cascode device.

9. The sense amplifier of claim 5, further comprising:
   a bias circuit to provide a bias signal to a gate of the cascode transistor, wherein a voltage level of the bias signal is based on a comparison between a target bitline voltage and a replica-bias signal provided within the bias circuit.

10. The sense amplifier of claim 9, wherein the voltage level of VDD is greater than the bitline voltage.

11. The sense amplifier of claim 10, further comprising a sense amplifier including an input terminal on which the bias signal is received.

12. The sense amplifier of claim 5, further comprising:
   a sense amplifier to compare a current or voltage on the senseline to a reference current or reference voltage, respectively.

* * * * *